United States Patent
Xiao et al.

(10) Patent No.: US 11,437,510 B2
(45) Date of Patent: Sep. 6, 2022

(54) TRENCH MOSFET AND METHOD OF MANUFACTURING TRENCH MOSFET

(71) Applicant: WUXI CHINA RESOURCES HUAJING MICROELECTRONICS CO., LTD., Jiangsu (CN)

(72) Inventors: Xuan Xiao, Jiangsu (CN); Jun Ye, Jiangsu (CN); Jie Li, Jiangsu (CN)

(73) Assignee: WUXI CHINA RESOURCES HUAJING MICROELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 17/253,597

(22) PCT Filed: Dec. 27, 2019

(86) PCT No.: PCT/CN2019/129261
§ 371 (c)(1),
(2) Date: Dec. 17, 2020

(87) PCT Pub. No.: WO2020/135735
PCT Pub. Date: Jul. 2, 2020

(65) Prior Publication Data
US 2021/0273092 A1    Sep. 2, 2021

(30) Foreign Application Priority Data
Dec. 27, 2018 (CN) .......................... 201811607412.6

(51) Int. Cl.
*H01L 29/78* (2006.01)
*H01L 21/765* (2006.01)
(Continued)

(52) U.S. Cl.
CPC ........ *H01L 29/7813* (2013.01); *H01L 21/765* (2013.01); *H01L 29/0696* (2013.01);
(Continued)

(58) Field of Classification Search
None
See application file for complete search history.

(56) References Cited

U.S. PATENT DOCUMENTS 9,496,382 B2 * 11/2016 Li ...................... H01L 29/4236
2003/0011028 A1    1/2003 Hshieh et al.
(Continued)

FOREIGN PATENT DOCUMENTS

| CN | 1528020 A | 9/2004 |
| CN | 103346166 A | 10/2013 |
| CN | 104637990 A | 5/2015 |

OTHER PUBLICATIONS

ISA State Intellectual Property Office of the People's Republic of China, International Search Report Issued in Application No. PCT/CN2019/129261, dated Mar. 26, 2020, WIPO, 4 pages.
(Continued)

*Primary Examiner* — Robert K Carpenter
(74) *Attorney, Agent, or Firm* — McCoy Russell LLP

(57) ABSTRACT

The present disclosure discloses a trench MOSFET and a method of manufacturing trench MOSFET. The trench MOSFET includes a substrate, an epitaxial layer, a plurality of trenches, and body region; the substrate has a first conductivity type; the epitaxial layer has the first conductivity type; the plurality of trenches are formed in the epitaxial layer, and at least two of the plurality of trenches are communicated with each other a gate structure is provided in the trench; the body region has a second conductivity type and has a second conductivity type and is disposed among the plurality of trenches.

14 Claims, 5 Drawing Sheets

(51) Int. Cl.
*H01L 29/06* (2006.01)
*H01L 29/10* (2006.01)
*H01L 29/40* (2006.01)
*H01L 29/66* (2006.01)

(52) U.S. Cl.
CPC ........ *H01L 29/1095* (2013.01); *H01L 29/407* (2013.01); *H01L 29/66734* (2013.01)

(56) References Cited

U.S. PATENT DOCUMENTS

| | | |
|---|---|---|
| 2013/0328122 A1 | 12/2013 | Li et al. |
| 2015/0137220 A1 | 5/2015 | Li et al. |
| 2017/0018643 A1 | 1/2017 | Takaya et al. |
| 2018/0005959 A1* | 1/2018 | Wang .................. H01L 29/0696 |

OTHER PUBLICATIONS

ISA State Intellectual Property Office of the People's Republic of China, Written Opinion of the International Searching Authority Issued in Application No. PCT/CN2019/129261, dated Mar. 26, 2020, WIPO, 8 pages.

State Intellectual Property Office of the People's Republic of China, Office Action and Search Report Issued in Application No. 201811607412.6, dated Jul. 14, 2021, 10 pages. (Submitted with Partial Translation).

State Intellectual Property Office of the People's Republic of China, Office Action and Search Report Issued in Application No. 201811607412.6, dated Feb. 28, 2022, 14 pages. (Submitted with Machine/Partial Translation).

* cited by examiner

TRENCH MOSFET AND METHOD OF MANUFACTURING TRENCH MOSFET

CROSS REFERENCE TO RELATED APPLICATIONS

The present application is a U.S. National Phase of International Application No. PCT/CN2019/129261 entitled "TRENCH MOSFET AND MANUFACTURING METHOD FOR TRENCH MOSFET," and filed on Dec. 27, 2019. International Application No. PCT/CN2019/129261 claims priority to Chinese Patent Application No. 201811607412.6 filed on Dec. 27, 2018. The entire contents of each of the above-listed applications are hereby incorporated by reference for all purposes.

TECHNICAL FIELD

This application relates to the field of semiconductor technology, and in particular to a trench MOSFET and a method of manufacturing trench MOSFET.

BACKGROUND AND SUMMARY

In the development of the semiconductor field, for medium-high voltage Metal-Oxide-Semiconductor Field-Effect Transistors (MOSFETs), increasing the channel density of the MOSFET has become the focus of research.

A SGTMOS (Shield Gate Trench MOS) includes a substrate, an epitaxial layer on the substrate, and a device structure in the epitaxial layer. The trenches and body regions of the SGTMOS have a strip-shaped structure, and a conductivity type of only a portion of the body region adjoining to the trenches can be inverted, thus, density of the conductive channels is small.

Embodiments of the present disclosure provides a trench MOSFET and a method of manufacturing trench MOSFET.

According to one aspect of the embodiments of the present disclosure, a trench MOSFET is provided. The trench MOSFET including:
  a substrate, having a first conductivity type;
  an epitaxial layer, having the first conductivity type;
  a plurality of trenches provided in the epitaxial layer, wherein at least two of the plurality of trenches are communicated with each other, and a gate structure is provided in the trench; and
  a body region, having a second conductivity type, and arranged among the trenches.

According to a second aspect of the embodiments of the present disclosure, a method of manufacturing trench MOSFET is provided. The method including:
  providing a substrate having a first conductivity type;
  forming, on the substrate, an epitaxial layer having the first conductivity type;
  forming, on the epitaxial layer, a plurality of trenches, at least one of which is communicated with at least two of the plurality trenches;
  preparing a gate structure in each of the plurality of the trench, and preparing a body region having a second conductivity type among the trenches.

In the present disclosure, at least one trench of the trench MOSFET is communicated with at least two other trenches, and the body region is arranged among the trenches, so that area of the surface of the body region adjoining to the trenches is increased, and area of an region where the conductivity type can be inverted so as to form an inverted layer is increased. thereby increasing the density of the inversion layer formed in the body region, that is, increasing the density of the conductive channel, and reducing the channel resistance of the trench MOSFET, thereby reducing the specific on-resistance of the trench MOSFET.

DETAILED DESCRIPTION

Hereinafter, embodiments of the present disclosure will be described in detail with reference to the drawings. Without conflict, the following embodiments and features in the embodiments can be combined with each other.

Figure 1:
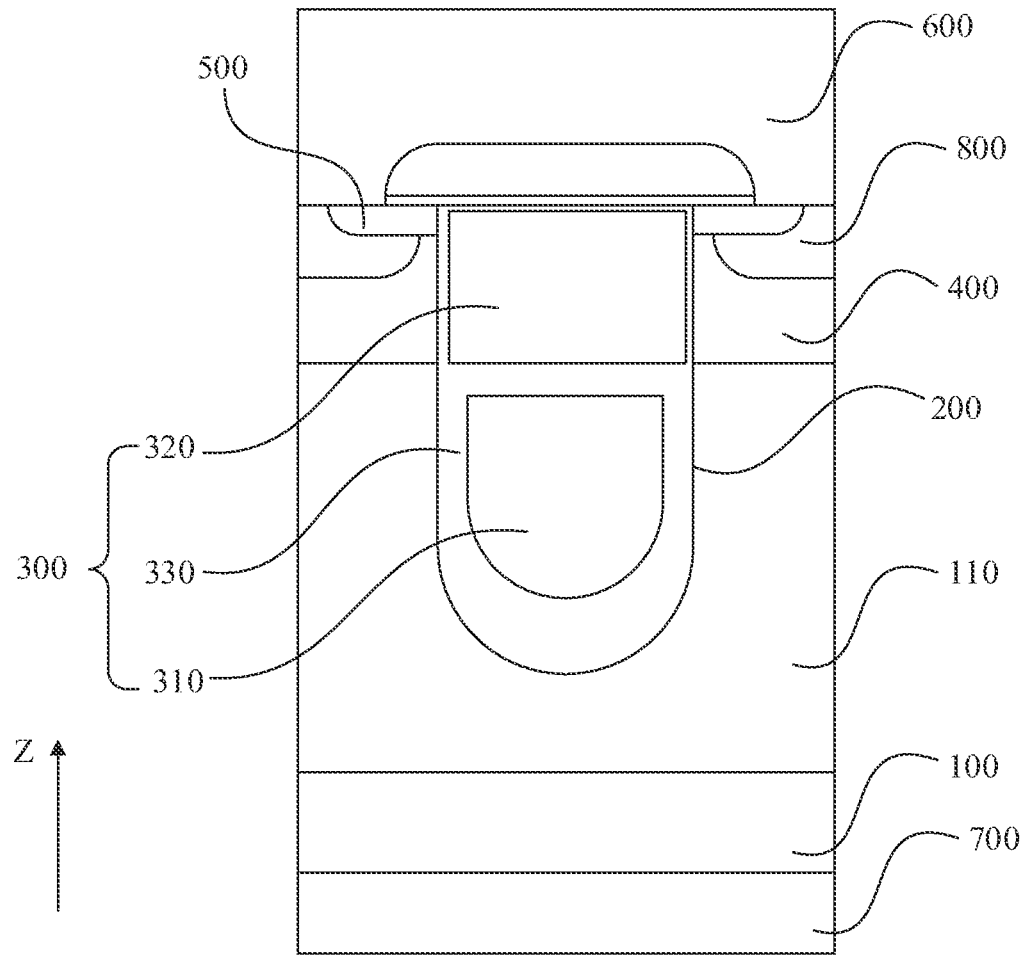
FIG. 1 is a schematic cross-sectional structure diagram of a trench MOSFET according to an embodiment of the present disclosure.
Figure 2:
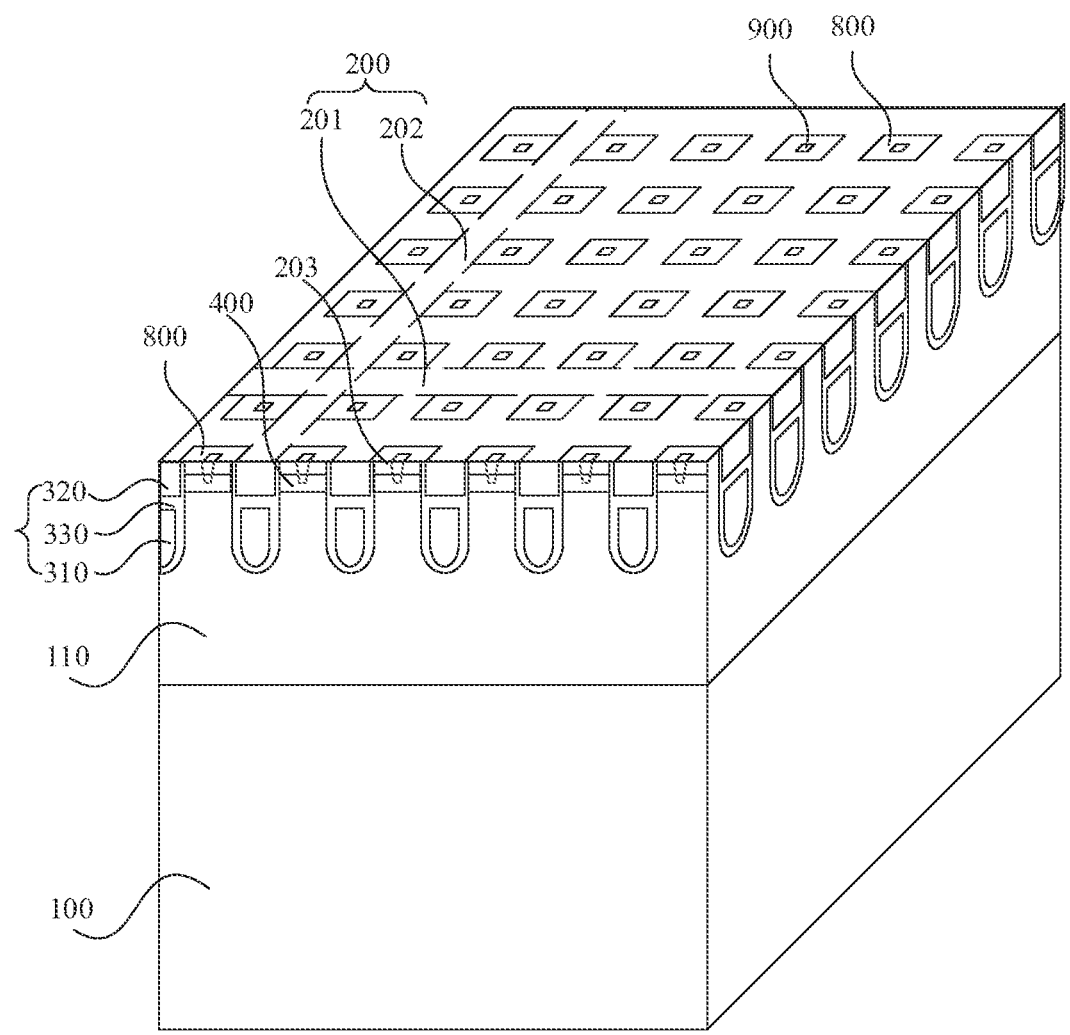
FIG. 2 is a schematic diagram of a perspective structure of a trench MOSFET according to an embodiment of the present disclosure.
Figure 3:
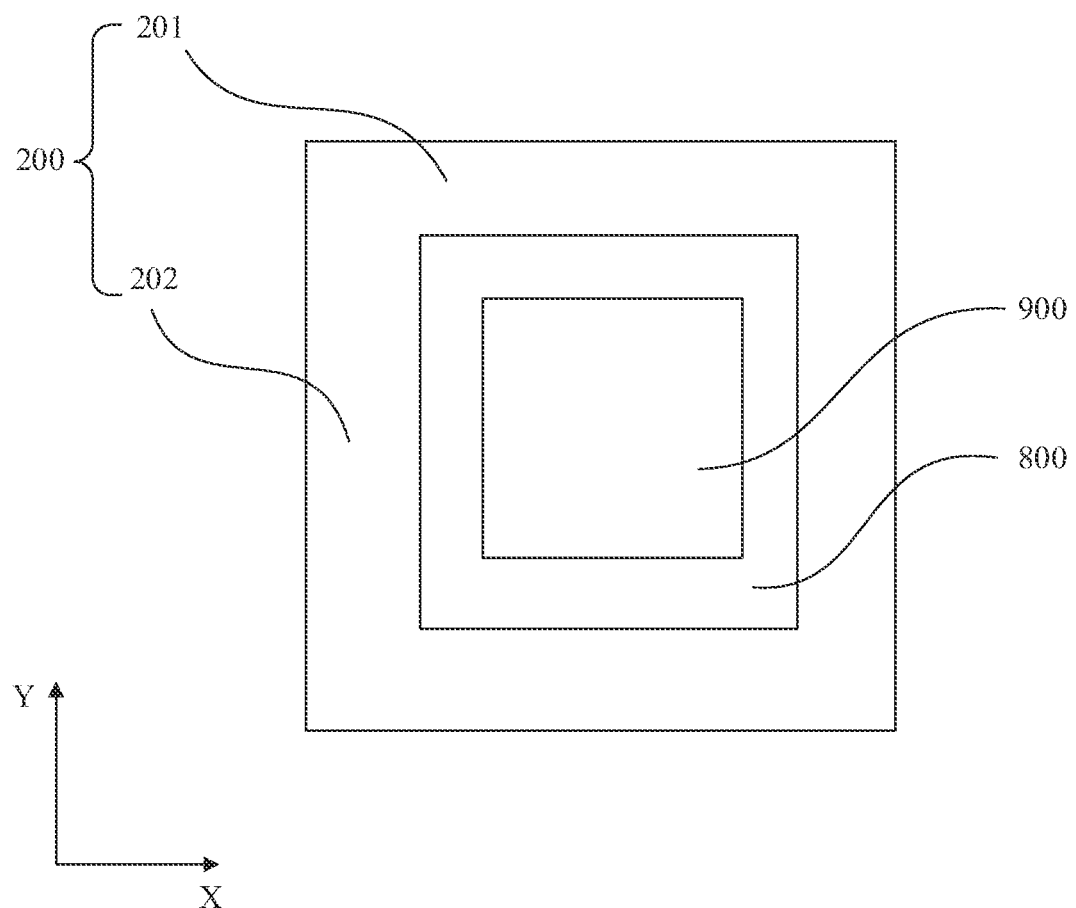
FIG. 3 is a schematic top view of a part of a trench MOSFET according to an embodiment of the disclosure.

As illustrated in FIGS. 1 to 3, the present disclosure discloses a trench MOSFET. The trench MOSFET includes a substrate 100, an epitaxial layer 110, a trench 200, a gate structure 300, a body region 400, a source layer 500, and a source 600 and a drain 700.

As illustrated in FIG. 1, the substrate 100 has a first conductivity type. An epitaxial layer 110 having the first conductivity type is formed on the substrate 100. A doping concentration of the epitaxial layer 110 is lower than a doping concentration of the substrate 100.

The trench 200 is formed in the epitaxial layer 110, and there are a plurality of trenches 200. At least two of the plurality of trenches 200 are communicated with each other. A gate structure 300 is provided in the trench 200.

As illustrated in FIGS. 1 and 2, in an embodiment, the gate structure 300 includes a shielding gate electrode 310, a control gate electrode 320 and a dielectric layer 330. The control gate electrode 320 is disposed above the shielding gate electrode 310, and the dielectric layer 330 envelopes the shielding gate electrode 310 and envelopes a side portion and a bottom portion of the control gate electrode 320. The dielectric layer 330 includes a field oxide layer enveloping the shielding gate electrode 310 and a gate oxide layer enveloping the side portion of the control gate electrode 320. The field oxide layer located at the bottom portion and the side portion of the shield gate electrode 310 may be formed by thermal oxidation deposition, and the field oxide layer located between the shield gate electrode 310 and the control gate electrode 320 may be formed by high density plasma chemical vapor deposition (HDP-CVD) process. Compared with the traditional trench MOSFET, an on-resistance of the trench MOSFET of the present disclosure can be reduced by 40%.

The body region 400 has a second conductivity type, and the body region 400 is disposed on the epitaxial layer 110 and among the trenches 200. In an embodiment, one trench 200 is communicated with at least two other trenches 200, and the body region 400 is disposed among the trenches 200, so that area of a surface of the body region 400 adjoining to the trenches 200 increases, and a region, the conductivity type of which can be inverted so as to form an inversion layer, becomes larger, a density of the inversion layer in the body region 400 is increased, that is, a density of a conductive channel is increased, and a channel resistance of the trench MOSFET is reduced, thus, a specific on-resistance of the trench MOSFET is reduced.

As illustrated in FIG. 1, the source layer 500 is provided on the body region 400 and adjoining to the trenches 200. The source layer 500 has the first conductivity type, and a doping concentration of the source layer 500 is greater than that of the body region 400.

The source electrode 600 is disposed above the source layer 500, the body region 400 and the gate structure 300.

The drain electrode 700 is provided under the substrate 100.

In an embodiment, in a case that no voltage is applied across the gate structure 300 and the source electrode 600, the first conductivity type is N-type, and the second conductivity type is P-type. That is, the substrate 100 is an N-type substrate 100, the epitaxial layer 110 is an N-type epitaxial layer 110, the body region 400 is P-doped, and the source layer 500 is N-doped.

A forward voltage is applied across the gate structure 300 and the source electrode 600, and minority carriers in the body region 400, i.e., electrons, are attracted to a surface of the gate structure 300 by an electric field. As the forward biased voltage across the gate structure 300 and the source electrode 600 increases, more electrons are attracted to the region, so that a density of electrons on the surface of the gate structure 300 is greater than that of holes, which results in "inversion", that is, change of the conductivity type. A material of the body region 400 on the surface of the gate structure 300 changes from P-type to N-type, so as to form an N-type channel, and current can flow to a N+ type region of the source electrode 600 directly through the drain electrode 700, a N+ type region in a lower portion of the substrate 100, a N− type region of the epitaxial layer 110, and the N-type channel around the gate structure 300.

In the embodiment, the body region 400 has a shape of polygon with a plurality of side surfaces. In an embodiment, the body region 400 has at least three side surfaces adjoining to the trenches 200, that is, the body region 400 has at least three areas that can be affected by the gate structure 300 in the trench 200. When a forward voltage is applied across the gate structure 300 and the source 600 in the trench 200, a conductivity type of the body region 400 adjoining to the side of the trench 200 can be inversed to form an inversion layer, that is, a material in this region of the body region changes from P-type to N-type, so as to form an N-type channel. The density of the inversion layer formed in the body region 400 is increased, that is, the density of the conductive channel is increased, and the channel resistance of the trench MOSFET is reduced, thereby reducing the specific on-resistance of the trench MOSFET.

In an embodiment, the body region 400 has four side surfaces, and the four side surfaces of the body region 400 all adjoin to the trenches 200, so that the conductivity type can be changed in areas near the four side surfaces of the body region 400 so as to form conductive channels. The density of the conductive channel is increased, and the channel resistance of the trench MOSFET is reduced, thereby reducing the specific on-resistance of the trench MOSFET.

In an embodiment, the trench 200 may be formed in the epitaxial layer 110 by photolithography and etching technology. Of course, the trench 200 can also be obtained in other ways.

In an embodiment, as illustrated in FIGS. 2 and 3, the trenches 200 includes a first trench 201 extending along a first direction X and a second trench 202 extending along a second direction Y, wherein there is a non-zero included angle between each of the first direction X and the second direction Y and a height direction Z. Furthermore, there is a non-zero included angle between the first direction X and the second direction Y, so that the first trench 201 and the second trench 202 intersecting with each other form a mesh trench 200.

A body region 400 is provided between the first trench 201 and the second trench 202. The first trench 201 and the second trench 202 respectively extend in different directions to form a mesh structure surrounding the body region 400, so that the side surfaces of the body region 400 can adjoin to the first trench 201 or the second trench 202.

In an embodiment, the first direction X is a transverse direction of the substrate 100, and the second direction Y is a longitudinal direction of the substrate 100. Both the transverse direction and the longitudinal direction are perpendicular to the height direction Z. The body region 400 is a rectangular column structure. With such an arrangement, area of each side surface of the body region 400 that adjoins to the trench 200 is the same, so that the distribution of regions where change of the conductivity type can occur in the body region 400 is relatively uniform. In other embodiments, the first direction X and the second direction Y may be any directions intersecting with each other. It is only required that there is an non-zero included angle between the first direction X and the second direction Y, so that the first trench 201 intersects with the second trench 202.

In an embodiment, there are a plurality of the first trenches 201 and a plurality of the second trenches 202, the distances between every two adjacent first trenches 201 are the same, and the distances between every two adjacent second trenches 202 are the same and equal to the distances between every two adjacent first trenches 201. The first trench 201 and the second trench 202 form a uniformly distributed mesh structure, so that the size of each body region 400 is the same and the area adjoining to the trench 200 of each body region 400 is also the same, so that the regions of the inversion layer formed by inverting the conductivity type of the body regions 400 are relatively uniform, that is, the distribution of the conductive channels is uniform.

In an embodiment, the trench MOSFET further includes a contact layer 800. The contact layer 800 is disposed above the body region 400, and the contact layer 800 is further used to connect the body region 400 and the source electrode 600 (see FIG. 1). The source electrode 600 is located above the contact layer 800 and the trench 200.

As illustrated in FIGS. 2 and 3, a contact hole 900 extending from an upper surface of the contact layer 800 down to the body region 400 is formed in the contact layer 800 and the body region 400, and the contact hole 900 is used to receive a metal of the source electrode 600. The upper surface of the contact layer 800 is flush with an upper surface of the epitaxial layer on both sides of an opening of the trench 200. In this way, it is convenient for the source electrode 600 to be formed on the upper surface of the contact layer 800 and the upper surface of the epitaxial layer on both sides of the opening of the trench 200. In order to clearly illustrates a positional relationship between the contact layer 800, the contact hole 900 and the trench 200, the three are not drawn in scale in FIG. 3.

Figure 4:
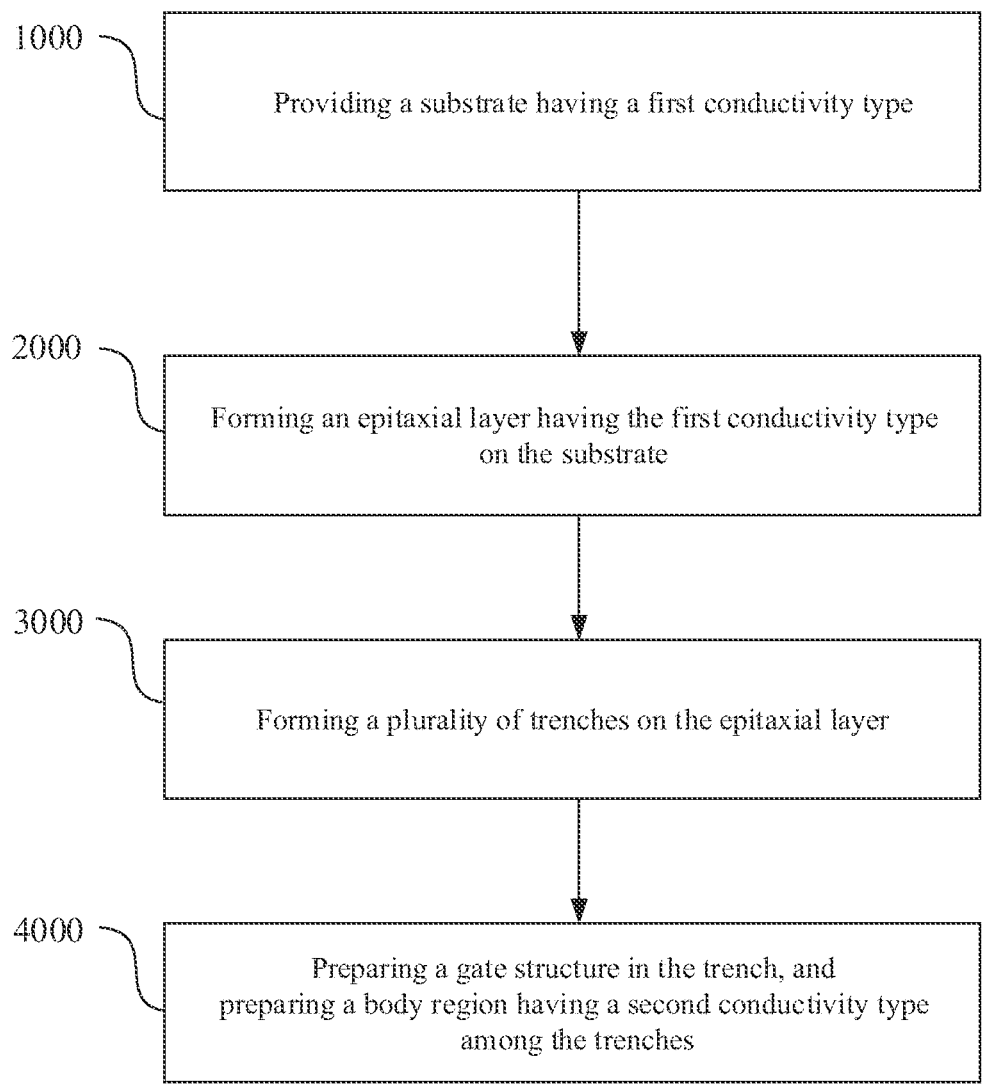
FIG. 4 is a flowchart of a method of manufacturing a trench MOSFET according to an embodiment of the present disclosure.
Figure 5:
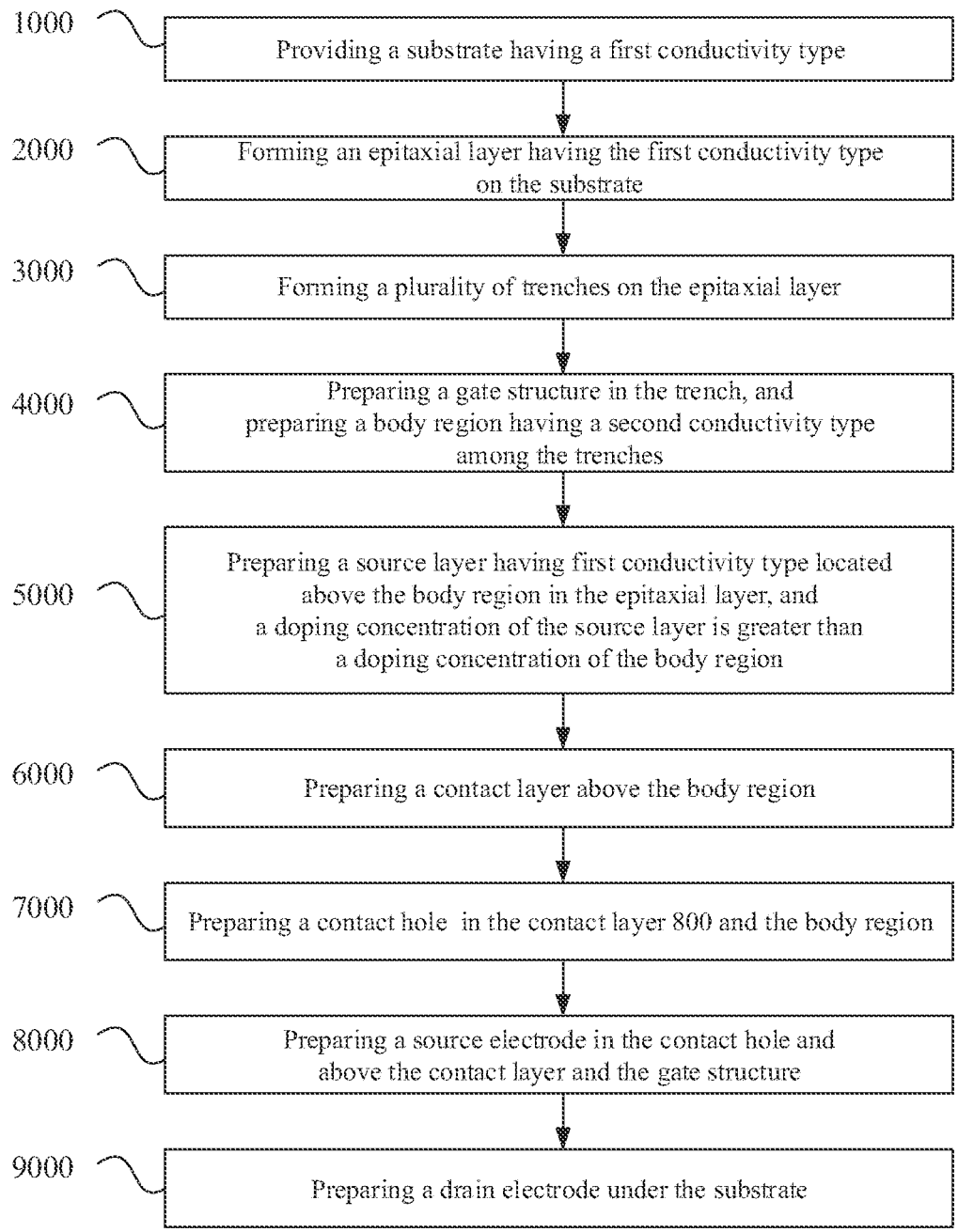
FIG. 5 is another flowchart of a method of manufacturing a trench MOSFET according to an embodiment of the present disclosure.

As illustrated in FIG. 4 and FIG. 5, the present disclosure further discloses a method of manufacturing a trench MOSFET. As illustrated in FIG. 4, the method includes the following steps:

Step 1000: a substrate 100 having a first conductivity type is provided.

Step 2000: an epitaxial layer 110 having the first conductivity type is formed on the substrate 100.

Step 3000: a plurality of trenches 200 is formed on the epitaxial layer 110, and at least two trenches 200 are communicated with each other.

Step 4000: a gate structure 300 is prepared in the trench 200; a body region 400 having a second conductivity type is prepared among the trenches 200.

In this embodiment, the method of manufacturing trench MOSFET is to form the trench 200 in the epitaxial layer 110 first, and then form the body region 400 in the epitaxial layer 110. Of course, in other embodiments, the body region 400 may be formed in the epitaxial layer 110 first, and then the trench 200 is formed, by etching or the like, in the epitaxial layer 110 having the body region 400, the body region 400 located at a position of the trench 200 is removed, and the body region 400 located among the trenches 200 remains, so as to form the body region 400 as illustrated in FIG. 2. In this embodiment, the first conductivity type is N-type, and the second conductivity type is P-type.

In an embodiment, the trench 200 is formed in the epitaxial layer 110 by photolithography and etching technology.

In an embodiment, an N-type doped semiconductor may be used as the substrate 100, and the N-type lightly doped semiconductor may be deposited on an upper portion of the substrate 100 by an epitaxial growth method to form the epitaxial layer 110.

In an embodiment, a doping concentration of the epitaxial layer 110 is less than a doping concentration of the lower portion of the substrate 100, and the trench 200 is prepared in the epitaxial layer 110.

In an embodiment, a P-type body region is formed in the epitaxial layer 110 by implanting impurities and annealing process.

In an embodiment, the gate structure 300 in step 4000 includes a shielded gate electrode 310. Meanwhile, in this embodiment, the gate structure 300 further includes a control gate electrode 320 and a dielectric layer 330. The control gate electrode 320 is located above the shield gate electrode 310. The dielectric layer 330 envelopes the shielding gate electrode 310 and envelopes a side portion and a bottom portion of the control gate electrode 320.

In an embodiment, the dielectric layer 330 enveloping the shielding gate electrode 310 is a field oxide layer, and the dielectric layer 330 enveloping the side of the control gate electrode 320 is a gate oxide layer.

In this embodiment, the field oxide layer is formed on the bottom portion and a lower sidewall of the trench 200 by thermal oxidation deposition, the shielding gate electrode 310 is formed by depositing polysilicon and etching technology, and the field oxide layer is formed above the shielding gate electrode 310 by high-density plasma chemical vapor deposition (HDP-CVD) process and etching process, a gate oxide layer is formed on an upper sidewall of the trench 200 by thermal oxidation deposition, and the control gate electrode 320 is formed on the field oxide layer by deposition of polysilicon and etching technology.

In this way, the body region 400 is disposed among the trenches 200, so that a surface area of the body region 400 adjoining to the trenches 200 is increased, and an area where the conductivity type can be inverted to form the inversion layer becomes larger, thereby increasing a density of the inversion layer formed in the body region 400, that is, increasing the density of the conductive channel, and reducing the channel resistance of the trench MOSFET, thereby reducing the specific on-resistance of the trench MOSFET.

As illustrated in FIG. 5, the following steps are performed after step 4000:

Step 5000: a source layer 500 having first conductivity type located above the body region 400 is prepared in the epitaxial layer 110, and a doping concentration of the source layer 500 is greater than a doping concentration of the body region 400.

In an embodiment, an N-type source layer 500 is formed on the upper portion of the body region 400 by implanting impurities and annealing process.

Step 6000: a contact layer 800 is prepared above the body region 400.

In an embodiment, the contact layer 800 is formed among the trenches 200 and above the body region 400 by chemical vapor deposition.

Step 7000: a contact hole 900 is prepared in the contact layer 800 and the body region 400.

In an embodiment, a contact hole 900 is formed in both the contact layer 800 and the body region 400 by photolithography and etching technology.

Step 8000: a source electrode 600 is prepared in the contact hole 900 and above the contact layer 800 and the gate structure 300.

In an embodiment, by a metal sputtering process, a metal is filled in the contact hole 900 and a metal layer is formed on the contact layer 800, and the metal in the contact hole 900 and the metal layer form the source electrode 600.

Step 9000: a drain electrode 700 is prepared under the substrate 100.

In an embodiment, the drain electrode 700 is formed by a metal evaporation process. In addition, there is no definite sequence between step 9000 and step 1000 to step 8000.

The above is only a preferred embodiment of the present disclosure, and does not limit the present invention in any form. Although the present invention has been disclosed as a preferred embodiment, it is not intended to limit the present invention. Any person familiar with this profession can make some changes or modifications to equivalent embodiments with equivalent changes by using the technical contents disclosed above without departing from the scope of the technical scheme of the present disclosure. However, any simple modifications, equivalent changes and modifications made to the above embodiments according to the technical essence of the present disclosure are still within the scope of the technical solution of the present disclosure.

The contents disclosed in this patent document contain materials that are protected by copyright. The copyrights are all the copyrights owners. The copyrights owner does not revert the patent documents or patent disclosures present in the official records and profiles of the Patent and Trademark Office to anyone.

The invention claimed is:
1. A trench MOSFET comprising:
a substrate, having a first conductivity type;
an epitaxial layer, having the first conductivity type;
a plurality of trenches, formed in the epitaxial layer,
wherein at least two of the plurality of trenches are communicated with each other, and a gate structure is provided in each trench of the plurality of trenches;

a body region, having a second conductivity type and disposed among the plurality of trenches;

a source layer, disposed above the body region and adjoined to the trench;

a contact layer, disposed above the body region;

a source electrode located above the contact layer and the trench;

a plurality of contact holes provided in the contact layer and the body region, and each of the plurality of contact holes extending from an upper surface of the contact layer down to the body region, and configured to receive a metal of the source electrode.

2. The trench MOSFET according to claim 1, wherein the body region has a plurality of side surfaces and each of at least three of the side surfaces of the body region adjoins to one of the plurality of trenches.

3. The trench MOSFET according to claim 2, wherein the body region has four side surfaces, and each of the four side surfaces adjoins to one of the plurality of trenches.

4. The trench MOSFET according to claim 1, wherein the plurality of trenches comprises a first trench extending in a first direction and a second trench extending in a second direction, an included angle between each of the first direction and the second direction and the height direction is non zero, and an included angle between the first direction and the second direction is non zero, so that the first trench and the second trench intersect each other so as to form a mesh trench; and the body region is provided between the first trench and the second trench.

5. The trench MOSFET according to claim 4, wherein the first direction is a transverse direction of the substrate, the second direction is a longitudinal direction of the substrate, and the transverse direction and the longitudinal direction is perpendicular to the height direction; the body region is a rectangular column structure.

6. The trench MOSFET according to claim 4, wherein there is a plurality of the first trenches and a plurality of the second trenches, and distance s between every two adjacent first trenches are equal to each other, distance s between every two adjacent second trenches are equal to each other and equal to the distances between every two adjacent first trenches.

7. The trench MOSFET according to claim 4, further comprising a drain electrode, located under the substrate.

8. The trench MOSFET according to claim 7, wherein the upper surface of the contact layer is flush with an upper surface of the epitaxial layer on both sides of an opening of the trench.

9. The trench MOSFET according to claim 1, wherein the gate structure comprises a shielding gate electrode, a control gate electrode located above the shielding gate electrode, and a dielectric layer enveloping the shielding gate electrode and enveloping a side portion and a bottom portion of the control gate electrode.

10. A method of manufacturing trench MOSFET, comprising:

providing a substrate having a first conductivity type;

forming, on the substrate, an epitaxial layer having the first conductivity type;

forming, on the epitaxial layer, a plurality of trenches, at least two of which are communicated with each other;

preparing a gate structure in each trench of the plurality of trenches;

preparing a body region having a second conductivity type among the trenches;

preparing a contact layer above the body region;

preparing contact holes in the contact layer and the body region; and preparing a source electrode in each contact hole and above the contact layer and each gate structure.

11. The method of manufacturing trench MOSFET according to claim 10, wherein the trenches intersect with each other.

12. The method of manufacturing trench MOSFET according to claim 11, wherein an included angle between the trenches is 90 degrees, and the plurality of the trenches intersect with each other to form a uniformly distributed mesh structure.

13. The method of manufacturing trench MOSFET according to claim 10, further comprising:

preparing, above the body region in the epitaxial layer, a source layer having the first conductivity type, wherein a doping concentration of the source layer is greater than a doping concentration of the body region.

14. The method of manufacturing trench MOSFET according to claim 10, wherein forming, on the epitaxial layer, a plurality of trenches, at least two of which are communicated with each other, comprises:

forming a body region on the epitaxial layer first, and then forming the trench in the epitaxial layer on which the body region is formed;

removing a portion of the body region located at a position of the trench, and retaining a portion of the body region located among the trenches.

* * * * *